United States Patent
Senzaki et al.

(10) Patent No.: US 6,238,734 B1
(45) Date of Patent: May 29, 2001

(54) LIQUID PRECURSOR MIXTURES FOR DEPOSITION OF MULTICOMPONENT METAL CONTAINING MATERIALS

(75) Inventors: Yoshihide Senzaki, Carlsbad; David Allen Roberts, Escondido; John Anthony Thomas Norman, Encinitas, all of CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/350,074

(22) Filed: Jul. 8, 1999

(51) Int. Cl.$^7$ .................................................. C23C 16/18
(52) U.S. Cl. ..................... 427/226; 427/229; 427/240; 427/244; 427/255.31; 427/255.32; 427/255.394
(58) Field of Search ................................. 427/124, 126.1, 427/226, 229, 240, 244, 255.31, 255.32, 255.394

(56) References Cited

U.S. PATENT DOCUMENTS

| | | | |
|---|---|---|---|
| 4,058,430 | 11/1977 | Suntola et al. | 156/611 |
| 5,204,314 | 4/1993 | Kirlin et al. | 505/1 |
| 5,820,664 | 10/1998 | Gardiner et al. | 106/287.17 |
| 5,853,799 | * 12/1998 | Larkin . | |
| 5,952,047 | * 9/1999 | Tasaki et al. . | |
| 6,015,917 | * 1/2000 | Bhandari et al. . | |

FOREIGN PATENT DOCUMENTS

WO98/46617  10/1998  (WO) .

OTHER PUBLICATIONS

Gordon, Roy G.; Barry, Sean T.; , et al. "Liquid Compounds for CVD of Alkaline Earth Metals" Abstract, MRS Meeting, San Francisco, Apr. 7, 1999.

Gordon, Roy G.;. et al. "New Liquid Precursors for Chemical Vapor Deposition" Fall 1997 MRS Meeting Symposium W, paper 7.3.

Guglielmi, M. et al. "Compositional and Microstructural Characterization of RuO2–TiO2 Catalysts Synthesized by the Sol–Gel Method", Electrochem. Soc., vol. 139, No. 6, Jun. 1992.

Cava, R. F., et al., "Enhancement of the Dielectric Constant of $Ta_2O_5$ through Substitution with $TiO_2$", Letters to Nature, vol. 377, Sep. 21, 1995.

Schulz, Douglas L. and Tobin J. Marks, "MOCVD Routes to Thin Metal Oxide Films for Superconducting Electronics" Adv. Mater. 1994, 6, No. 10 (no month).

Sun, X., et al. "Reactively Sputtered Ti–SiN films. II. Diffusion barriers for AL and Cu metalization on Si" J. Appl. Phys. 81 (2), Jan. 15, 1997.

Van Dover, R. B., et al. "Investigation of Ternary Transition—Metal Nitride Systems by Reactive Cosputtering" Chem. Mater. 1993, 5, 32–35 (no month).

Hara, Nobuyoshi, et al., "Formation of Al2O3—Ta2O5 Double Oxide Thin Films by Low–Pressure MOCVD and Evaluation of Their Corrosion Resistances in Acid and Alkali Solutions" Journal of Electrochemical Society, 146 (2) 510–516 (no month).

Sheppard, Laurel M., "Advances in Processing of Ferroelectric Thin Films" Ceramic Bulletin, vo. 71, No. 1 1992 (no month).

\* cited by examiner

Primary Examiner—Timothy Meeks
(74) Attorney, Agent, or Firm—Geoffrey L. Chase

(57) ABSTRACT

The present invention is a composition for deposition of a mixed metal or metal compound layer, comprising a solventless mixture of at least two metal-ligand complex precursors, wherein the mixture is liquid at ambient conditions and the ligands are the same and are selected from the group consisting of alkyls, alkoxides, halides, hydrides, amides, imides, azides cyclopentadienyls, carbonyls, and their fluorine, oxygen and nitrogen substituted analogs. The present invention is also a process for deposition of a multiple metal or metal compound layer on a substrate of an electronic material, comprising: a) providing a solventless mixture of two or more metal-ligand complex precursors which constitute a liquid at ambient conditions, wherein the ligands are the same and are selected from the group consisting of alkyls, alkoxides, halides, hydrides, amides, imides, azides, nitrates, cyclopentadienyls, carbonyls, and their fluorine, oxygen and nitrogen substituted analogs; b) delivering the solventless mixture by direct liquid injection to a flash vaporization zone to vaporize the solventless mixture; c) contacting the substrate under deposition conditions with a resulting vapor of the solventless mixture, and c) depositing a multiple metal or metal compound layer on the substrate from the solventless mixture.

11 Claims, No Drawings

LIQUID PRECURSOR MIXTURES FOR DEPOSITION OF MULTICOMPONENT METAL CONTAINING MATERIALS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The semiconductor fabrication industry requires materials and deposition technology adequate to deposit metals, metal mixtures and metal compound mixtures in thin layers, plugs, vias and patterns on semiconductor and insulating or dielectric substrates to make appropriate electrical devices for integrated circuits, memory devices and flat panel display devices.

Various techniques are known for depositing metals, metal compounds and their mixtures on appropriate electronic materials substrates, including; physical methods (sputtering, molecular beam epitaxy, evaporation and laser ablation), alloying, and chemical vapor deposition (plasma, photo or laser enhanced, low pressure and high temperature).

Various multiple metal oxides are known in the literature, including those recited in: "Advances in Processing of Ferroelectric Thin Films", L. M. Sheppard, Ceramic Bulletin, Vol. 71, No. 1, (1992), pp. 85–95; "Formation of $Al_2O_3$—$Ta_2O_5$ Double-Oxide Thin Films by Low-Pressure MOCVD and Evaluation of Their Corrosion Resistances in Acid and Alkali Solutions", Hara, et. al., Journal of the Electrochemical Society, 146 (2) (1999), pp. 510–516; "High Coercivity in $Sm_2Fe_{17}N_x$ Magnets", Schnitzke, et. al., Appl. Phys. Lett. 57 (26) Dec. 24, 1990, pp. 2853–2855; "Investigation of Ternary Transition-Metal Nitride Systems by Reactive Cosputtering", Van Dover, et. al., Chem. Mater. (1993), Vol. 5, pp. 32–35; "Reactively Sputtered Ti—Si—N Films II. Diffusion Barriers for Al and Cu Metallizations on Si", Sun, et. al., J. Appl. Phys., 81 (2) Jan. 15, 1997, pp. 664–671; "MOCVD Routes to Thin Metal Oxide Films for Superconducting Electronics", Schulz, et. al., Adv. Mater. (1994), 6 No. 10, pp. 719–730; "Compositional and Microstructural Characterization of $RuO_2$—$TiO_2$ Catalysts Synthesized by the Sol-Gel Method", Guglielmi, et. al., J. Electrochem. Soc., Vol. 139, No. 6, June 1992, pp. 1665–1661; "Enhancement of the Dielectric Constant of $Ta_2O_5$ Through Substitution with $TiO_2$", Cava, et. al., Nature, Vol. 377, 21, September 1995, pp. 215–217; and U.S. Pat. No. 4,058,430, the latter of which also discloses the deposition process known as "atomic layer epitaxy".

Chemical vapor deposition (CVD) has gained favor in recent years due to its properties of providing uniform and conformal deposition and its ability to deposit an array of materials under highly controllable conditions. Typically, chemical vapor deposition can provide high deposition rates of high purity materials in a controlled fashion.

However, chemical vapor deposition has several drawbacks which make its implementation challenging. Not all desired chemicals are sufficiently volatile to make themselves amenable to chemical vapor deposition. Some chemicals are solids at storage or delivery conditions. Some chemicals are too volatile for adequate storage and delivery.

The situation for chemical vapor deposition is further complicated by the need to co-deposit several chemicals such as in multiple metal chemical vapor deposition, such as multiple metal oxide chemical vapor deposition. It is possible for metal precursors to react with one another or for at least one metal precursor for CVD to be too volatile or too involatile, i.e., a solid.

To overcome these disadvantages of CVD, the prior art has used solvents to dissolve solid metal precursors or blend liquid, particularly viscous liquid, metal precursors for CVD.

U.S. Pat. No. 5,204,314 discloses a foraminous device for flash vaporization of liquid mixtures or solvent mixtures of metal precursors for CVD.

U.S. Pat. No. 5,820,664 describes various solvent mixtures of mixed metal compound precursors, which are useful for CVD.

However, solvent systems for liquid delivery for CVD are problematic because compatible, volatile solvents must be chosen. Solvents decrease the amount of effective reagent that is delivered for a given flow and time period. More importantly, solvents introduce yet another reagent into the sensitive reaction zone where delicate semiconductor and electronic device fabrication is being performed. The adverse effects of such solvent presence must be considered. Finally, solvents represent an environmental and cost factor. The solvent or its degradation products must be recycled, captured or treated subsequent to utilization.

International Patent Application WO98/46617 describes metal precursors and processes for deposition of metals from mixed β-diketonates. The application addresses liquid delivery of metal precursors for CVD and other depositions by direct liquid injection. Using mixed β-diketonates enhances the liquid state of the precursors to facilitate delivery. Solvents are an option for the liquid mixtures.

Similar disclosures appeared in "New Liquid Precursors for Chemical Vapor Deposition", Gordon, et. al., Mater. Res. Soc. Symp. Proc., 495, (1998), pp. 63–68; and "Liquid Compounds for CVD of Alkaline Earth Metals", Gordon, et. al., MRS Meeting, Apr. 7, 1999, San Francisco, Calif.

The prior art attempts to provide appropriate liquid media for metal precursor delivery have required the use of selected solvents or mixed β-diketonate ligands to assure liquid conditions for delivery. Solvents constitute problems of contamination and abatement. Mixed ligands constitute problems of inadvertent ligand exchange which can lead to non-liquid conditions. The β-diketonate ligands frequently lead to solid metal compounds absent manipulation of the β-diketonate substituents to avoid conditions leading to solid conditions, thus aggravating the consequences of inadvertant ligand exchange. The present invention overcomes these drawbacks by using a solventless, common ligand mixture of metals in a liquid state for deposition preferably by direct liquid injection to avoid solvent and ligand exchange drawbacks for consistent deposition performance.

BRIEF SUMMARY OF THE INVENTION

The present invention is a process for deposition of a multiple metal or metal compound layer on a substrate of an electronic material, comprising:

a) providing a solventless mixture of two or more metal-ligand complex precursors which constitute a liquid at ambient conditions, wherein the ligands are the same and are selected from the group consisting of alkyls, alkoxides, halides, hydrides, amides, imides, azides, nitrates, cyclopentadienyls, carbonyls, and their fluorine, oxygen and nitrogen substituted analogs;

b) delivering the solventless mixture to a deposition zone where the substrate is located;

c) contacting the substrate under deposition conditions with the solventless mixture, where the contacting under deposition conditions is selected from the group consisting of chemical vapor deposition, spray pyrolysis, sol-gel processing, spin coating, and atomic layer epitaxy, and d) depositing a multiple metal or metal compound layer on the substrate from the solventless mixture.

The present invention is more preferably a process for deposition of a multiple metal or metal compound layer on a substrate of an electronic material, comprising:

a) providing a solventless mixture of two or more metal-ligand complex precursors which constitute a liquid at ambient conditions, wherein the ligands of the precursors are the same and are selected from the group consisting of alkyls, alkoxides, halides, hydrides, amides, imides, azides, nitrates, cyclopentadienyls, carbonyls, and their fluorine, oxygen and nitrogen substituted analogs;

b) delivering the solventless mixture by direct liquid injection to a flash vaporization zone to vaporize the solventless mixture;

c) contacting the substrate under deposition conditions with a resulting vapor of the solventless mixture, and d) depositing a multiple metal or metal compound layer on the substrate from the solventless mixture.

Preferably, the ambient conditions are less than or equal to 40° C. and less than or equal to 30 psig.

More preferably, the ambient conditions are 20–30° C. and 5–6 psig.

Preferably, the solventless mixture is mixed with a source of oxygen prior to depositing the multiple metal compound layer on the substrate.

Preferably, the source of oxygen is selected from the group consisting of 95+% by volume oxygen, ozone, nitrous oxide, nitric oxide, nitrogen dioxide, water, hydrogen peroxide, air and mixtures thereof.

Alternately, the solventless mixture is mixed with a source of nitrogen prior to depositing the multiple metal compound layer on the substrate.

Preferably, the source of nitrogen is selected from the group consisting of nitrogen, ammonia, hydrazine, alkylhydrazine, hydrogen azide, alkylamine and mixtures thereof.

Preferably, the deposition process for producing a multiple metal or metal compound layer on the substrate from the solventless mixture is selected from the group consisting of chemical vapor deposition, spray pyrolysis, sol-gel processing, spin coating, and atomic layer epitaxy.

Preferably, the multiple metal or metal compound layer is selected from the group consisting of mixed metal alloys, mixed metal oxides, mixed metal nitrides, mixed metal carbides, mixed metal carbonitrides, mixed metal oxycarbonitrides, mixed metal oxycarbides, mixed metal sulfides, mixed metal phosphides, mixed metal arsenides, mixed metal antimonides, mixed metal selenides, mixed metal tellurides and mixtures thereof.

The present invention is also a composition for deposition of a mixed metal or metal compound layer, comprising a solventless mixture of at least two metal-ligand complex precursors, wherein the mixture is liquid at ambient conditions and the ligands of the precursors are the same and are selected from the group consisting of alkyls, alkoxides, halides, hydrides, amides, imides, azides, nitrates, cyclopentadienyls, carbonyls, and their fluorine, oxygen and nitrogen substituted analogs.

Preferably, the mixture contains a first metal-ligand complex precursor which is liquid at ambient conditions and a second metal-ligand complex precursor which is liquid at ambient conditions.

Alternately, the mixture contains a first metal-ligand complex precursor which is liquid at ambient conditions and a second metal-ligand complex precursor which is solid at ambient conditions, but which is miscible in the first metal-ligand complex precursor.

Preferably, the metals of the solventless mixture of at least two metal-ligand complex precursors are individually selected from the group consisting of zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium rhenium, iron, ruthenium, osmium, cobalt, rhodium, iridium, nickel, palladium, platinum, copper, silver, gold, silicon and cerium.

Preferably, the ligand of the solventless mixture of at least two metal-ligand complex precursors is selected from the group consisting of dimethyl amido, diethyl amido, ethylmethyl amido, butyl amido, dipropyl amido, methylpropyl amido, ethylpropyl amido, methoxy, ethoxy, propoxy, and butoxy.

Preferably, the solventless mixture of at least two metal-ligand complex precursors comprises $Zr(N(CH_2CH_3)_2)_4$, $Sn(N(CH_2CH_3)_2)_4$ and $Ti(N(CH_2CH_3)_2)_4$.

Alternately, the solventless mixture of at least two metal-ligand complex precursors comprises $Zr(N(CH_3)_2)_4$, $Sn(N(CH_3)_2)_4$ and $Ti(N(CH_3)_2)_4$.

Further alternately, the solventless mixture of at least two metal-ligand complex precursors comprises $Zr(O(C_4H_9))_4$, $Sn(O(C_4H_9))_4$ and $Ti(O(C_4H_9))_4$.

Further alternatively, the solventless mixture of at least two metal-ligand complex precursors comprises $Ta(N(CH_3)_2)_5$ and $Ti(N(CH_3)_2)_4$.

Further alternatively, the solventless mixture of at least two metal-ligand complex precursors comprises $CH_3CH_2N=Ta(N(CH_2CH_3)_2)_3$ and $Ti(N(CH_2CH_3)_2)_4$.

Further alternatively, the solventless mixture of at least two metal-ligand complex precursors comprises $Al(OCH_2CH_3)_3$ and $Ta(OCH_2CH_3)_5$.

Preferably, the solventless mixture of at least two metal-ligand complex precursors comprises $Si(N(CH_2CH_3)_2)$ and a metal-ligand complex precursor selected from the group consisting of $Ti(N(CH_2CH_3)_2)_4$, $Zr(N(CH_2CH_3)_2)_4$, $Hf(N(CH_2CH_3)_2)_4$, $V(N(CH_2CH_3)_2)_5$, $V(N(CH_2CH_3)_2)_4$, $Nb(N(CH_2CH_3)_2)_5$, $Nb(N(CH_2CH_3)_2)_4$, $CH_3CH_2N=Nb(N(CH_2CH_3)_2)_3$, $CH_3CH_2N=V(N(CH_2CH_3)_2)_3$, $(CH_3CH_2N=)_2W(N(CH_2CH_3)_2)_2$, $(CH_3CH_2N=)_2Mo(N(CH_2CH_3)_2)_2$, and $CH_3CH_2N=Ta(N(CH_2CH_3)_2)_3$.

BRIEF DESCRIPTION OF SEVERAL VIEWS OF THE DRAWINGS

Not Applicable

DETAILED DESCRIPTION OF THE INVENTION

Multicomponent metal containing materials, such as mixed-metal oxides and nitrides often have unique physical properties that each individual metal oxide/nitride component does not possess. For example, some mixed metal oxides can be used for high dielectric constant materials, ferroelectrics, high temperature superconductors, catalysts, and corrosion resistant coatings. Also, some mixed metal nitrides show good diffusion barrier properties, superconducting, and magnetic properties.

In the electronics industry, as the size of integrated circuit (IC) devices becomes aggressively smaller, thin films deposited by chemical vapor deposition (CVD) demonstrate an advantage over physical vapor deposition (PVD) methods in terms of conformal coverage on various non-planar surfaces. In general, liquid precursors are preferred for CVD applications due to the ease and reproducibility in precursor delivery. Common precursor delivery methods used in CVD processing include vapor draw, bubbling with carrier gas, mist droplet (aerosol or spray) delivery, and direct liquid injection (DLI). DLI is particularly a preferred method for the delivery of multi-components because it delivers the same ratio of constituents to the reactor as are in the source container. DLI has the added advantage of storing the precursor at room temperature and heating only the amount required to be delivered, and therefore, improving precursor shelf life.

In the present invention, new liquid precursor mixture compositions are disclosed that can be used for precursor dispersing delivery methods, including DLI in CVD applications. The volatile components are chosen such that:

1) They are chemically compatible, therefore, no non-volatile polymeric or multinuclear species are formed;
2) No precipitates are generated due to ligand exchange on the metals or inter ligand reactions, i.e., the same ligand is used for all precursors (i.e., homoleptic, for the present invention, (RN)=M shall be deemed to be the same as $M(NR_2)$;
3) The mixtures maintain low viscosity and thermal stability; and
4) Undesired redox chemistry will not take place (eg. $M^{+1}+M'^{+3} \rightarrow M^{+2}+M'^{+2}$).

Liquid mixtures can be prepared either by directly mixing liquid metal-ligand complexes or dissolving solid metal-ligand complex(es) in liquid metal-ligand complex(es). In these systems, no solvent is needed or desired to dissolve or dilute the precursor mixtures to achieve a total liquid phase of the resulting mixtures. A broad range of CVD precursor solutions using organic solvents have previously been used as precursors for thin film depositions. The present invention's new solventless precursor mixtures lower the burden of abatement of the CVD effluent in the exhaust, because there is no extra volatile organic medium to be collected after the CVD processing. In addition, since no solvent is used in the liquid mixtures described herein, high throughput of metal containing vapor can be delivered into the CVD reactor. Thus, the overall CVD process using these new liquid precursor mixtures is more environmentally benign and cost effective than liquid injection delivery of precursor solutions stated in the prior art.

In addition to CVD or MOCVD (metal-organic CVD), the liquid mixtures of the present invention are amenable to atomic layer epitaxy, spin coating, spray pyrolysis and sol-gel processes. In atomic layer epitaxy, an approximately single layer of precursor molecules are adsorbed on a surface. A second reactant is dosed onto the first precursor layer followed by a reaction between the second reactant and the first reactant already on the surface. This alternating procedure is repeated to provide the desired thickness of element or compound in a near atomic thickness layer. The substrate temperature can be controlled to avoid undesired deposition. In spin coating, a liquid media is dispensed onto a spinning substrate and allowed to dry by the action of heat or reaction, etc. In spray pyrolysis, mist droplets (aerosol) are formed followed by thermal or photolytical decomposition of the precursor. In sol-gel processes, hydrolysis and condensation of precursors is performed where the precursors are deposited on the target substrate by spinning, dipping or spraying. The resulting amorphous films are annealed at relatively low temperatures (500–800° C.) to achieve crystallization and densification. In CVD using DLI, the solventless mixture is delivered from storage at ambient conditions in a liquid state to a flash vaporization zone, where the solventless mixture is quickly heated to the metal-ligand complex precursors' vaporization temperature, typically 100° C. to 500° C. These constitute the respective deposition conditions for the various deposition processes occurring in a deposition zone, such as a reaction chamber.

The multi-component precursors are selected from the group consisting of, but not limited to, metal alkyls, metal alkoxides, metal halides, metal hydrides, metal amides, metal imides, metal azides, metal nitrates, metal cyclopentadienyls, metal carbonyls, and their fluorine, oxygen and nitrogen substituted analogs. Preferably, the ligand of the solventless mixture of at least two metal-ligand complex precursors is selected from the group consisting of dimethyl amido, diethyl amido, ethylmethyl amido, butyl amido, dipropyl amido, methylpropyl amido, ethylpropyl amido, methoxy, ethoxy, propoxy, and butoxy. It is important to use the same or common ligands, homoleptic ligands, to avoid potential ligand exchange problems of the prior art. Preferably, the homoleptic ligands are monodentate.

The metal of the metal ligand precursor can be one or more of: zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, silicon and cerium.

The ambient conditions at which the solventless mixture of two or more metal ligand precursors must be liquid are defined as generally less than or equal to 40° C. and less than 30 psig. Preferably, the ambient conditions for liquid phase delivery are 20–30° C. and 5–6 psig.

Appropriate choice of precursors, in the presence of oxidant or nitrogen containing reactant, would provide either mixed metal oxides, nitrides, and oxynitrides. In addition, using proper precursor mixtures and CVD conditions, it is also possible to grow mixed metal alloys, carbides, carbonitrides, oxycarbides, oxycarbonitrides, sulfides, phosphides, arsenides, antimonides, selenides, and tellurides. The oxidant or nitrogen containing reactant includes but is not limited to: 95+% by volume oxygen, ozone, water, hydrogen peroxide, nitrous oxide, nitric oxide, nitrogen dioxide, air, nitrogen gas, ammonia, hydrazine, alkylhydrazine, alkylamines and mixtures thereof.

In addition to thermal CVD, the above precursors could be used for plasma, laser or photo enhanced CVD deposition, a well recognized deposition technique, or by atomic layer epitaxy. Furthermore, appropriate choice of liquid mixture precursors may also be applied to sol-gel processing, spray pyrolysis and spin coating of films.

Exemplary solventless mixtures of at least two metal-ligand complex precursors comprises $Zr(N(CH_2CH_3)_2)_4$, $Sn(N(CH_2CH_3)_2)_4$ and $Ti(N(CH_2CH_3)_2)_4$; or $Zr(N(CH_3)_2)_4$, $Sn(N(CH_3)_2)_4$ and $Ti(N(CH_3)_2)_4$; or $Zr(O(C_4H_9))_4$, $Sn(O(C_4H_9))_4$ and $Tl(O(C_4H_9))_4$; or $Ta(N(CH_3)_2)_5$ and $Ti(N(CH_3)_2)_4$; or $CH_3CH_2N=Ta(N(CH_2CH_3)_2)_3$ and $Ti(N(CH_2CH_3)_2)_4$; or $Al(OCH_2CH_3)_3$ and $Ta(OCH_2CH_3)_5$; or $Si(N(CH_2CH_3)_2)$ and a metal-ligand complex precursor selected from the group consisting of $Ti(N(CH_2CH_3)_2)_4$, $Zr(N(CH_2CH_3)_2)_4$, $Hf(N(CH_2CH_3)_2)_4$, $V(N(CH_2CH_3)_2)_5$, $V(N(CH_2CH_3)_2)_4$, $Nb(N(CH_2CH_3)_2)_4$, $CH_3CH_2N=Nb(N(CH_2CH_3)_2)_3$, $CH_3CH_2N=V(N(CH_2CH_3)_2)_3$, $(CH_3CH_2N=)_2W(N(CH_2CH_3)_2)_2$, $(CH_3CH_2N=)_2Mo(N(CH_2CH_3)_2)_2$, and $CH_3CH_2N=Ta(N(CH_2CH_3)_2)_3$.

The present invention will not be illustrated with several nonlimiting examples of precursors and depositions.

EXAMPLE 1

Zr—Sn—Ti—Ox precursor $Zr(N(CH_2CH_3)_2)_4$ 19.0 g (0.05 mol), $Sn(N(CH_2CH_3)_2)_4$ 20.4 g (0.05 mol), and $Ti(N(CH_2CH_3)_2)_4$ 50.5 g (0.15 mol) were mixed at room temperature under inert atmosphere to provide a yellow-orange transparent liquid mixture. This mixture was distilled under vacuum at the heating bath temperature range of 110–120° C., which indicates the utility for DLI delivery.

EXAMPLE 2

Ti—Ta—$O_x$

A solventless liquid mixture of metal-ligand complex precursors for Ti—Ta—$O_x$ can be formed from $Ta(N(CH_3)_2)_5$ (solid) dissolved in $Ti(N(CH_3)_2)_5$ (liquid) in the same manner as in Example 1.

EXAMPLE 3

Ti—Ta—$O_x$

A solventless liquid mixture of metal-ligand complex precursors for Ti—Ta—$O_x$ can be formed from $CH_3CH_2N=Ta(N(CH_2CH_3)_2)_3$ mixed in $Ti(N(CH_2CH_3)_2)_4$ in the same manner as in Example 1.

EXAMPLE 4

Al doped $TaO_x$

A solventless liquid mixture of metal-ligand complex precursors for Al doped $TaO_x$ can be formed from the mixture of $Al(OCH_2CH_3)_3$ (solid) and $Ta(OCH_2CH_3)_5$ (liquid) in the same manner as in Example 1.

EXAMPLE 5

M—Si—N

A solventless liquid mixture of metal-ligand complex precursors for M—Si—N can be formed in the same manner as in Example 1 from the mixtures of (a) $Si(N(CH_2CH_3)_2)_4$ (liquid) and (b) $M(N(CH_2CH_3)_2)_x$ where M=Ti, Zr, Hf, V, Nb and x=4 or 5, or (c) $(R-N=)_xM'(N(CH_2CH_3)_2)_y$ where M'=Ta, Nb, W, Mo, R=$C_{1-5}$ alkyl, x=1 and y=3 for M=Ta or Nb, x=y=2 for M'=W or Mo (all liquids).

EXAMPLE 6

Mixed Metal Compound Deposition by CVD

A solvent mixture $Zr(N(CH_2CH_3)_2)_4$, $Sn(N(CH_2CH_3)_2)_4$, and $Ti(N(CH_2CH_3)_2)_4$ metal-ligand complex precursors was delivered at 0.06 ml per minute to a direct liquid injection system with a vaporization temperature of 110° C. using a helium sweep gas of 120 sccm with an oxygen flow of 100 sccm, onto a wafer substrate target for mixed metal compound film deposition where the wafer was held at 240–300° C. The deposition was from 100 to 300 angstroms per minute. The reactor chamber pressure was 2 Torr. Energy dispersive X-ray analysis of the films deposited from the precursor mixture under these conditions by CVD demonstrated that Zr, Sn and Ti metals were incorporated in the deposited films.

Previous attempts to provide appropriate liquid media for metal precursor delivery have required the use of selected solvents or mixed β-diketonate ligands to assure liquid conditions for delivery. Solvents constitute an additional expense and cause problems of appropriate selection for compatibility, as well as problems of contamination and post-use abatement. Non-solvent attempts to solve the goal of liquid phase delivery involved mixed, β-diketonate ligands, but these constitute problems of inadvertent ligand exchange which can lead to non-liquid conditions. The β-diketonate ligands frequently lead to solid metal compounds, absent manipulation of the β-diketonate substituents to avoid conditions leading to solid conditions, thus aggravating the consequences of inadvertent ligand exchange. The present invention has been shown to overcome these drawbacks by using a solventless, nonβ-diketonate, singular or common ligand in a metal-ligand complex of a mixture of metals in a liquid state for deposition preferably by direct liquid injection to avoid solvent and β-diketonate ligand exchange drawbacks for consistent deposition performance.

The present invention has been set forth with regard to several preferred 10 embodiments, however, the full scope of the present invention should be ascertained from the claims which follow.

What is claimed is:

1. A process for deposition of an oxygen-containing multiple metal compound layer on a substrate of an electronic material, comprising:

a) providing a solventless mixture of two or more metal-ligand complex precursors which constitute a liquid at ambient conditions, wherein said ligands of said two or more metal-ligand complex precursors are the same and are selected from the group consisting of alkyls, alkoxides, halides, hydrides, amides, imides, azides, nitrates, cyclopentadienyls, carbonyls, and their fluorine, oxygen or nitrogen substituted analogs;

b) delivering said solventless mixture to a deposition zone where said substrate is located;

c) contacting said substrate under deposition conditions with said solventless mixture and a source of oxygen, where said contacting said substrate under deposition conditions is selected from the group consisting of chemical vapor deposition, spray pyrolysis, sol-gel processing, spin coating, and atomic layer epitaxy, and d) depositing an oxygen-containing multiple metal compound layer on said substrate from said solventless mixture.

2. The process of claim 1 wherein said source of oxygen is selected from the group consisting of 95+% by volume oxygen, ozone, nitrous oxide, nitric oxide, nitrogen dioxide, water, hydrogen peroxide, air and mixtures thereof.

3. The process of claim 1 wherein said oxygen-containing multiple metal compound layer is selected from the group consisting of mixed metal oxides, mixed metal oxycarbonitrides, mixed metal oxycarbides, and mixtures thereof.

4. A process for deposition of an oxygen-containing multiple metal compound layer on a substrate of an electronic material, comprising:

a) providing a solventless mixture of two or more metal-ligand complex precursors which constitute a liquid at ambient conditions, wherein said ligands of said two or more metal-ligand complex precursors are the same and are selected from the group consisting of alkyls, alkoxides, halides, hydrides, amides, imides, azides, nitrates, cyclopentadienyls, carbonyls, and their fluorine, oxygen or nitrogen substituted analogs;

b) delivering said solventless mixture by direct liquid injection to a flash vaporization zone to vaporize said solventless mixture;

c) contacting said substrate under deposition conditions with a resulting vapor of said solventless mixture and a source of oxygen, and d) depositing an oxygen-containing multiple metal compound layer on said substrate from said solventless mixture.

5. The process of claim 4 wherein said ambient conditions are less than or equal to 40° C. and less than or equal to 30 psig.

6. The process of claim 4 wherein said ambient conditions are 20–30° C. and 5 to 6 psig.

7. The process of claim 4 wherein said source of oxygen is selected from the group consisting of 95+% by volume oxygen, ozone, nitrous oxide, nitric oxide, nitrogen dioxide, water, hydrogen peroxide, air and mixtures thereof.

8. A process for deposition of a nitrogen-containing multiple metal compound layer on a substrate of an electronic material, comprising:

a) providing a solventless mixture of two or more metal-ligand complex precursors which constitute a liquid at ambient conditions, wherein said ligands of said two or more metal-ligand complex precursors are the same and are selected from the group consisting of alkyls, alkoxides, halides, hydrides, amides, imides, azides, nitrates, cyclopentadienyls, carbonyls, and their fluorine, oxygen or nitrogen substituted analogs;

b) delivering said solventless mixture to a deposition zone where said substrate is located;

c) contacting said substrate under deposition conditions with said solventless mixture and a source of nitrogen, where said contacting said substrate under deposition conditions is selected from the group consisting of chemical vapor deposition, spray pyrolysis, sol-gel processing, spin coating, and atomic layer epitaxy, and d) depositing a nitrogen-containing multiple metal compound layer on said substrate from said solventless mixture.

9. The process of claim 8 wherein said source of nitrogen is selected from the group consisting of nitrogen, ammonia, hydrazine, alkylhydrazine, hydrogen azide, alkylamine and mixtures thereof.

10. A process for deposition of a nitrogen-containing multiple metal compound layer on a substrate of an electronic material, comprising:

a) providing a solventless mixture of two or more metal-ligand complex precursors which constitute a liquid at ambient conditions, wherein said ligands of said two or more metal-ligand complex precursors are the same and are selected from the group consisting of alkyls, alkoxides, halides, hydrides, amides, imides, azides, nitrates, cyclopentadienyls, carbonyls, and their fluorine, oxygen or nitrogen substituted analogs;

b) delivering said solventless mixture by direct liquid injection to a flash vaporization zone to vaporize said solventless mixture;

c) contacting said substrate under deposition conditions with a resulting vapor of said solventless mixture and a source of nitrogen, and d) depositing a nitrogen-containing multiple metal compound layer on said substrate from said solventless mixture.

11. The process of claim 10 wherein said source of nitrogen is selected from the group consisting of nitrogen, ammonia, hydrazine, alkylhydrazine, hydrogen azide, alkylamine and mixtures thereof.

* * * * *